United States Patent [19]
Sonntag et al.

[11] Patent Number: 5,547,095
[45] Date of Patent: Aug. 20, 1996

[54] ELECTRONICS AND INSTRUMENTATION ENCLOSURE AND A FRAME THEREFOR

[75] Inventors: John-Erik Sonntag, Tammisaari; Matti Ropponen, Espoo, both of Finland

[73] Assignee: Fibox Oy AB, Tammisaari, Finland

[21] Appl. No.: 330,244

[22] Filed: Oct. 11, 1994

[30] Foreign Application Priority Data

Oct. 11, 1993 [FI] Finland .................................. 934475

[51] Int. Cl.$^6$ ...................................... H02G 3/08
[52] U.S. Cl. .................... 220/3.8; 220/3.94; 220/4.02
[58] Field of Search ................................ 220/3.2, 3.94, 220/3.8, 4.02

[56] References Cited

U.S. PATENT DOCUMENTS

| | | | |
|---|---|---|---|
| 1,641,265 | 9/1927 | Gaynor | 220/3.94 |
| 1,991,160 | 2/1935 | Knight | 220/3.94 |
| 3,405,834 | 10/1968 | Butler et al. | 220/3.94 |
| 3,895,178 | 7/1975 | Huibrechtse | 220/3.94 |
| 4,818,822 | 4/1989 | Yahraus | 220/3.94 |

FOREIGN PATENT DOCUMENTS

| | | |
|---|---|---|
| 0123788 | 11/1984 | European Pat. Off. . |
| 2811342 | 9/1979 | Germany . |
| 3629566 | 3/1988 | Germany . |
| 91/01426 | 2/1991 | WIPO . |

*Primary Examiner*—Joseph M. Moy
*Attorney, Agent, or Firm*—Merchant, Gould, Smith, Edell, Welter & Schmidt, P.A.

[57] ABSTRACT

The invention relates to an electronics and instrumentation enclosure to be used for electronical, electrical and apparatus installations, preferably for measuring and regulating equipments, which enclosure comprises a lower portion (1'), a frame (2') and a cover (3'), the lower portion comprising fixing points (4') for components to be mounted between the lower portion and the frame. In order to enable versatile component mountings, the frame (2') comprises fixing means (11') for fixing two component mounting plates (7' and 10') on both sides of the frame in such a way that one mounting plate (7') is positioned on the frame side facing the cover (3') and the other mounting plate (10') is positioned on the frame side facing the lower portion (1'). To the frame (2') is preferably connected a hinged cover (3') arranged to cover the frame substantially entirely including screws (5') by which the frame is secured to the lower portion (1'). This solution enables a simple sealing of the enclosure.

2 Claims, 1 Drawing Sheet

ELECTRONICS AND INSTRUMENTATION ENCLOSURE AND A FRAME THEREFOR

BACKGROUND OF THE INVENTION

The invention relates to an electronics and instrumentation enclosure to be used for electronical, electrical and apparatus installations, preferably for measuring and regulating equipments, which enclosure comprises a lower portion, a frame and a cover, the lower portion comprising fixing points for components to be mounted between the lower portion and the frame. The invention also relates to a frame to be used in such an enclosure.

Known separate electronics and instrumentation enclosures are not applicable to so many types of installation needs as would be desirable. On account of this, enclosures of various shapes and sizes exist on the market. It would naturally be more convenient if the same enclosure could be applied to installations of as many types as possible. Then both the manufacturer and the user of the enclosure could rationalize the arrangements associated with the practical problems concerning enclosuring.

SUMMARY OF THE INVENTION

The object of the present invention is to provide an electronics and instrumentation enclosure, which considerably reduces especially the above drawback associated with the known enclosures.

For this purpose, the enclosure according to the invention comprises fixing means for fixing two component mounting plates on both sides of the frame in such a way that one mounting plate is positioned on the frame side facing the cover and the other mounting plate is positioned on the frame side facing the lower portion. Preferred embodiments of the enclosure are presented in the attached claims 2 and 3. The frame according to the invention is defined in the attached claim 4. One preferred embodiment of the frame is presented in claim 5.

The major advantage of the electronics and instrumentation enclosure according to the invention is that decisively more versatile component mountings on different levels will be possible compared with known enclosures. Additionally, one preferred embodiment enables a simple sealing of the enclosure, which is not possible with prior art enclosures requiring several sealing points (each screw shall be sealed).

In the following, the invention will be described in more detail by means of a preferred embodiment with reference to the attached drawing.

Figure 1:
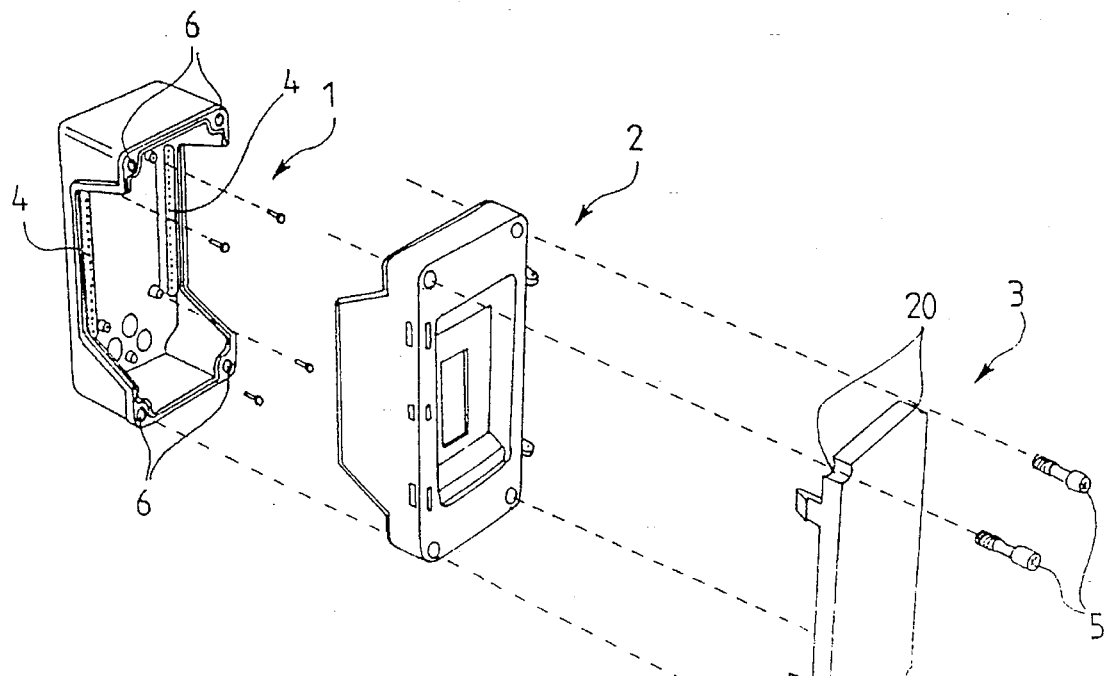
FIG. 1 shows an exploded view of a prior art enclosure to be used for electronical, electrical and apparatus installations

A prior art electronics and instrumentation enclosure of FIG. 1 comprises a lower portion 1, a frame 2 and a cover 3. The long sides of the lower portion 1 comprise fixing point ribs 4 provided with bores, to which ribs various components can be fixed by means of screws. The frame 2 is fixed with screws 5 to fixing projections 6 of the lower portion.

DETAILED DESCRIPTION OF THE PREFERRED EMBODIMENT

Figure 2:
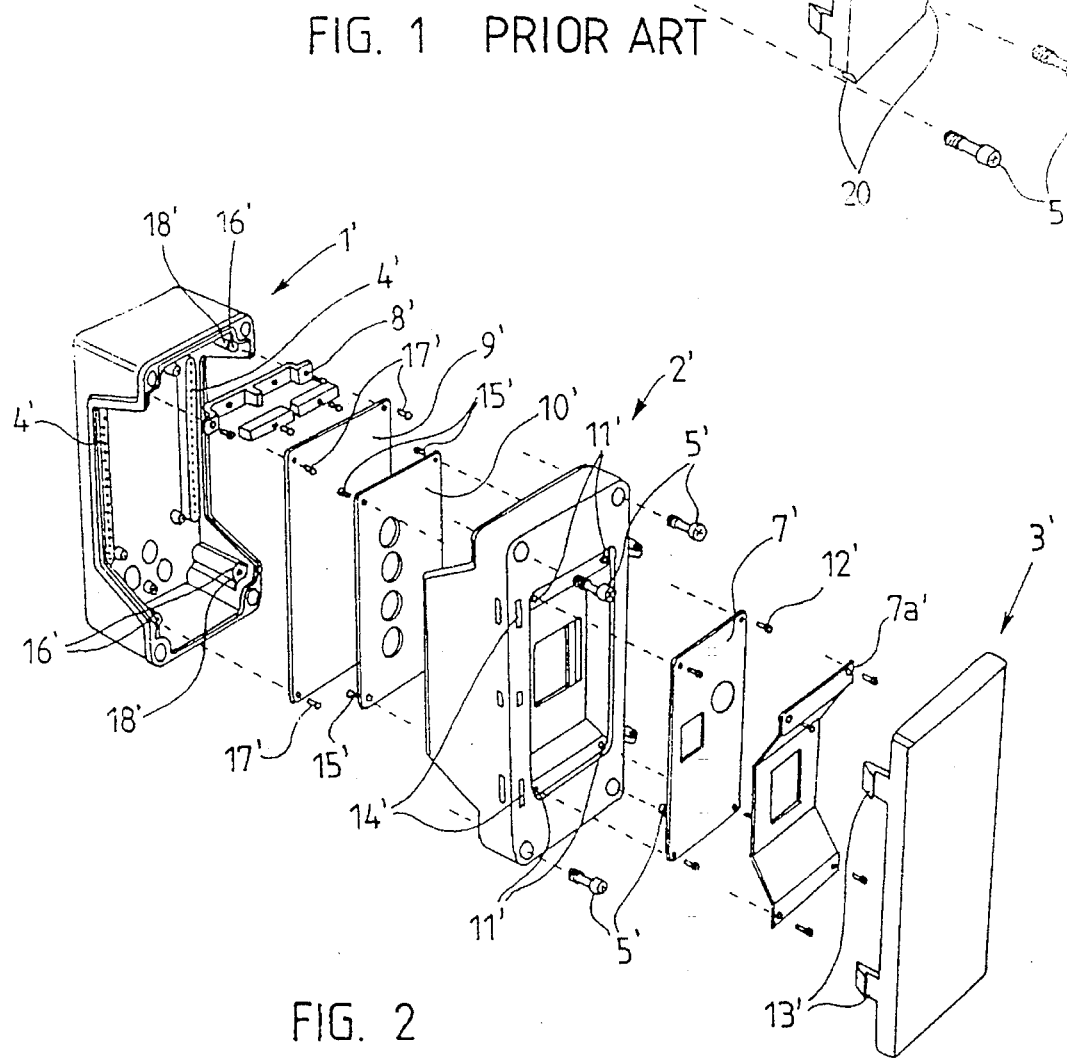
FIG. 2 shows an enclosure according to the invention to be used for electronical, electrical and apparatus installations.

An electronics and instrumentation enclosure according to the invention shown in FIG. 2 is provided with reference numerals corresponding to those used for corresponding parts of the enclosure of FIG. 1. The enclosure of FIG. 2 comprises fixing point ribs 4' for fixing a DIN rail (not shown). Elevated parts 16' provided with holes 18' are positioned at the corners of a lower portion 1' of the enclosure. The elevated parts 16' are for securing a mounting console 8' which is for receiving an earth bar (not shown). A bottom plate 9' can be secured to the holes 18' of the elevated parts 16' with screws 17'. The bottom plate 9' serves for fixing components (not shown) thereon in such a way that the components are positioned on the side of the bottom plate 9' facing the lower portion 1'. A frame 2' is arranged to receive a front or mounting plate 7', for which four holes 11' are made in the frame 2' for screws 12'. Also the side of the frame 2' facing the lower portion 1' is arranged to receive a mounting plate 10'. For this purpose, the frame 2' is provided with holes (not shown in the figures) for screws 15'. The components to be mounted to be supported by the mounting plate 10' are to be positioned on the side of the mounting plate facing the lower portion 1'. The mounting plates 9' and 10' are typically alternative in practice. Reference mark 7a' indicates a contact protection plate, being an alternative to the front plate 7' and used when no component bearing front plate is needed. The purpose of the contact protection plate 7a' is to eliminate the risk of an electric shock.

The structure of the cover in FIG. 2 differs from the cover 3 of FIG. 1 in such a way that the corners of the cover 3' are not provided with recesses 20 for screws as in FIG. 1, but the cover 3' covers the frame 2' entirely—including screws 5'. Thanks to the above, the cover 3' of the enclosure according to the invention, hinged on the frame 2', seals as such or is easy to arrange to seal the enclosure structure without a necessity to seal each screw 5 separately, as in the construction according to FIG. 1. The cover 3' comprises flexible bayonet connection tongues 13' communicating with locking holes 14' in the frame 2' when the cover is shut. The cover 3' is preferably made of plastic.

The invention has been described above by means of one embodiment only, and therefore, it is emphasized that the details of the enclosure and frame according to the invention can be implemented in many ways within the scope of the attached claims. Accordingly, the fixing means for securing the mounting plate 10' to the frame 2' are not necessarily screws 15', but some other fixing means, such as bayonet connection means, may be applied instead. Essential for the invention is that a mounting plate can be fixed on both sides of the frame, if desired. The cover 3' can be secured to the frame 2' also by other fixing means than the ones presented. Accordingly, the bayonet connection means 13', 14' are not necessary; the fixing can alternatively be implemented by means of one single screw, which can be sealed.

We claim:

1. An electronics and instrumentation enclosure to be used for electronic, electrical and apparatus installations having a plurality of mounting levels, the enclosure comprising:

a first mounting level being a lower portion, the lower portion comprising fixing points for components to be mounted;

a frame, the frame being fastened to the lower portion by means of screws, the components being mounted between the lower portion and the frame;

a cover, the cover being formed to cover the frame substantially entirely including the screws by which the frame is secured to the lower portion and the cover is hinged on the frame; and the frame comprising means defining holes for fixing two component mounting plates on both sides of the frame, the two component mounting plates being a second mounting level and a third mounting level, respectively, wherein one of the component mounting plates is positioned on the frame side facing the cover, and the other component mounting plate is positioned on the frame side facing the lower portion, so that versatile components are mounted on different mounting levels.

2. An enclosure according to claim 1, wherein the cover comprises flexible bayonet connection tongues for fastening the cover to corresponding holes in the frame.

* * * * *

UNITED STATES PATENT AND TRADEMARK OFFICE
CERTIFICATE OF CORRECTION

PATENT NO. : 5,547,095

DATED : August 20, 1996

INVENTOR(S): Sonntag et al.

It is certified that error appears in the above-identified patent and that said Letters Patent is hereby corrected as shown below:

Col. 1, lines 36-38: Delete "Preferred embodiments of the enclosure are presented in the attached claims 2 and 3."

Col. 1, line 39: "4" should read "1"

Col. 1, lines 39-40: Delete "One preferred embodiment of the frame is presented in claim 5."

Signed and Sealed this

Twenty-third Day of June, 1998

Attest:

BRUCE LEHMAN

*Attesting Officer*    *Commissioner of Patents and Trademarks*